United States Patent
Mehas et al.

(10) Patent No.: US 6,975,163 B2
(45) Date of Patent: Dec. 13, 2005

(54) PRECISION MARGINING CIRCUITRY

(75) Inventors: Gustavo J. Mehas, Mercer Island, WA (US); James W. Leith, Seattle, WA (US); Brandon D. Day, Seattle, WA (US)

(73) Assignee: Intersil Americas, Inc., Milpitas, CA (US)

( * ) Notice: Subject to any disclaimer, the term of this patent is extended or adjusted under 35 U.S.C. 154(b) by 0 days.

(21) Appl. No.: 10/813,254

(22) Filed: Mar. 30, 2004

(65) Prior Publication Data

US 2005/0110561 A1 May 26, 2005

Related U.S. Application Data

(60) Provisional application No. 60/525,366, filed on Nov. 25, 2003.

(51) Int. Cl.[7] .............................................. G05F 1/10
(52) U.S. Cl. ..................................................... 327/540
(58) Field of Search ............................... 327/530, 534, 327/535, 537, 538, 540, 541, 543

(56) References Cited

U.S. PATENT DOCUMENTS 6,798,260 B1 * 9/2004 Wittlinger ................... 327/157

* cited by examiner

Primary Examiner—Jeffrey Zweizig
(74) Attorney, Agent, or Firm—Gary R. Stanford

(57) ABSTRACT

An IC including a margining control amplifier circuit, first and second offset pins, a margining control pin, select logic, and a mirror amplifier circuit. The margining control amplifier circuit drives current at an output to control voltage at an input based on a reference voltage. The first and second offset pins are provided to couple an external margining voltage divider. The margining control pin has at least two states including an up state and a down state. The select logic selectively switches the output of the margining control amplifier circuit between the first and second offset pins and selectively switches the input of the margining control amplifier circuit between the second and first offset pins based on a state of the margining control pin. The mirror amplifier circuit mirrors voltage across the first and second offset pins across a first margining resistor.

Figure 1:
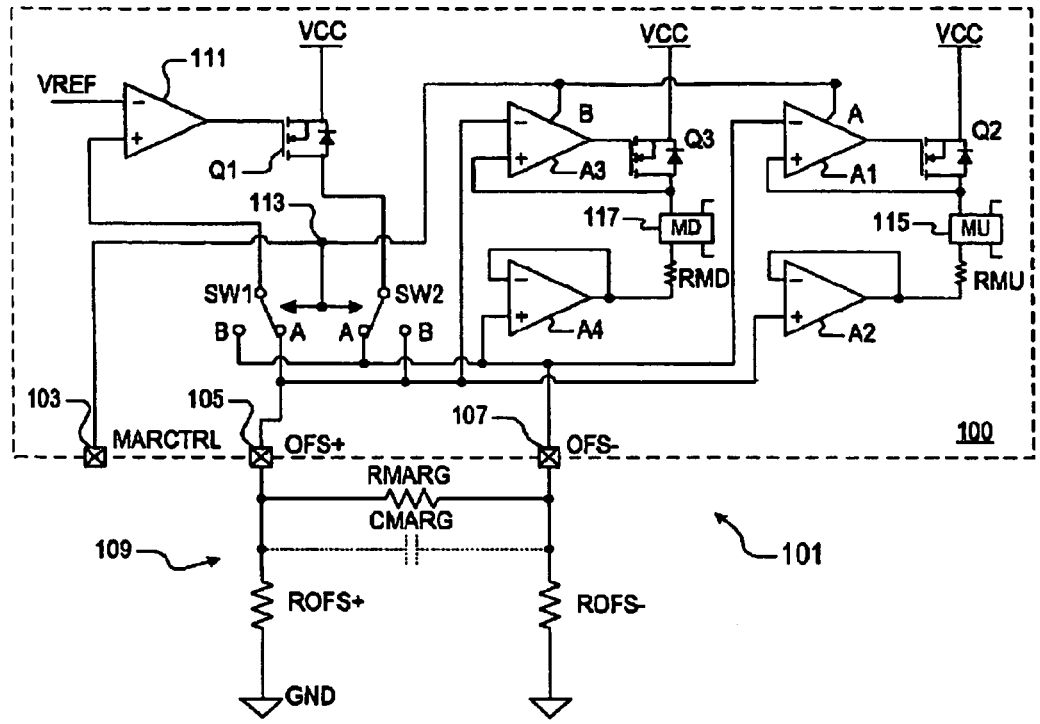

22 Claims, 2 Drawing Sheets

PRECISION MARGINING CIRCUITRY

CROSS-REFERENCE TO RELATED APPLICATIONS

This application claims the benefit of U.S. Provisional Application No. 60/525,366 filed on Nov. 25, 2003, which is herein incorporated by reference for all intents and purposes.

BACKGROUND OF THE INVENTION

1. Field of the Invention

The present invention relates to PWM power regulators and/or DC—DC converters, and more particularly to precision margining circuitry used to validate performance and reliability of system cards during manufacturing testing.

2. Description of the Related Art

Voltage margin circuitry used in power regulators allow for the raising and lowering of the output voltage relative to a nominal value. In many cases, voltage margining is used to validate performance and reliability of a system during manufacturing testing for quality control, such as computer motherboards, system peripheral cards, etc. In other cases, margining may be used to adjust the balance between performance and product lifetime. For example, performance may be increased by increasing voltage and/or clock rate of a system (e.g., computer graphics card), at the cost of reduced lifetime of the product. Alternatively, the clock and/or voltage may be reduced to increase life expectancy at reduced performance levels.

Many conventional techniques have been employed to implement margining, including physical component changes, external switches, etc. Such techniques were often inefficient and usually inaccurate. Margining circuitry often consumed valuable board space and/or consumed valuable time during manufacturing testing. Different manufacturers employ different margining specifications, which have been difficult to achieve using present techniques. One margining technique employed internal current sources to develop the margining voltage. Such current sources varied significantly (e.g. 10%) over process and temperature changes, resulting in substantial loss of precision. A dedicated pin had to be added to the integrated circuit (IC) to perform a reduction in set point error. Additional dedicated pins are not favored by IC designers and are avoided as often as possible.

It is desired to increase margining set point precision without the cost of additional pins to the part.

SUMMARY OF THE INVENTION

A precision margining circuit according to an embodiment of the present invention includes a first margining resistor, a first offset resistor, first and second amplifier circuits, and a feedback circuit. The first margining resistor is coupled between first and second margining nodes. The first offset resistor is coupled between the second margining node and a supply reference node (e.g., GND). The first amplifier circuit drives current to the first margining node to establish a reference voltage at the second margining node. The second amplifier circuit mirrors a first margining voltage developed between the first and second margining nodes across a second margining resistor to develop a first margining current. The feedback circuit adjusts a set point voltage based on the reference voltage and the first margining current.

The first amplifier circuit may include an amplifier having a first input receiving the reference voltage, a second input coupled to the second margining node and an output, and a current device having a current control input coupled to the output of the amplifier and a current path coupled the second margining node.

The precision margining circuit may include a current mirror having a current path input that senses the first margining current and a current path output that drives proportional current through a third margining resistor to develop a second margining voltage. The circuit may further include a summing circuit that adds the reference voltage to the second margining voltage to adjust the set point voltage.

The precision margining circuit may include a second offset resistor coupled between the first margining node and the supply reference node. In this case, select logic is provided which is responsive to a margining control node having up and down states to switch between applying up and down margining. The select logic is operative to couple an output and a feedback input of the first amplifier circuit to the first and second margining nodes, respectively, in the up state and to couple the output and feedback input of the first amplifier circuit to the second and first margining nodes, respectively, in the down state. The second amplifier circuit is enabled when the margining control node is in the up state. A third amplifier circuit is provided, which is enabled when the margining control node is in the down state, and which mirrors a second margining voltage developed between the first and second margin nodes across a third margining resistor to develop a second margining current. In this case, the feedback circuit adjusts the set point voltage based on the reference voltage and the first and second margining currents.

The precision margining circuit may include first and second current mirrors, each having a current path input that senses a corresponding one of the first and second margining currents, and a current path output that drives proportional current through a corresponding one of fourth and fifth margining resistors to develop a corresponding one of second and third margining voltages, respectively. In this case, feedback circuit incorporates the fourth and fifth margining resistors and adjusts the set point voltage based on the second and third margining voltages.

An integrated circuit (IC) according to an embodiment of the present invention includes a margining control amplifier circuit, first and second offset pins, a margining control pin, select logic, and a mirror amplifier circuit. The margining control amplifier circuit drives current at an output to control voltage at an input based on a reference voltage. The first and second offset pins are provided to couple an external margining voltage divider. The margining control pin has at least two states including an up state and a down state. The select logic selectively switches the output of the margining control amplifier circuit between the first and second offset pins and selectively switches the input of the margining control amplifier circuit between the second and first offset pins based on a state of the margining control pin. The mirror amplifier circuit mirrors voltage across the first and second offset pins across a first margining resistor.

The select logic of the IC may include first and second switches. The first switch has a common pole coupled to the input of the margining control amplifier circuit, first and second switched terminals coupled to the first and second offset pins, respectively, and a control input coupled to the margining control pin. The second switch has a common pole coupled to the output of the margining control amplifier circuit, first and second switched terminals coupled to the first and second offset pins, respectively, and a control input coupled to the margining control pin.

The IC may include an up margining resistor and a down margining resistor and an up amplifier circuit and a down amplifier circuit. The up amplifier circuit is enabled by the margining control pin when in the up state, in which it mirrors voltage between the first and second offset pins across the up margining resistor. The down amplifier circuit is enabled by the margining control pin when in the down state, in which it mirrors voltage between the first and second offset pins across the down margining resistor.

The IC may further include up and down current mirrors and second up and down margining resistors. The up current mirror has a current path input coupled in series with the first margining resistor and a current path output. The down current mirror has a current path coupled in series with the first down margining resistor and a current path output. The second up margining resistor is coupled to the current path output of the up current mirror for developing an up margining voltage. The second down margining resistor is coupled to the current path output of the down current mirror for developing a down margining voltage.

The IC may include a feedback circuit that adjusts a set point voltage based on the reference voltage and the up and down margining voltages. The feedback circuit may include a summing circuit, an OTA, and an error amplifier. The summing circuit combines the reference voltage and the up and down margining voltages. The OTA has an input coupled to the summing circuit and an output providing the set point voltage. The error amplifier controls a compensation signal based on a sampled output voltage and the set point voltage. The IC may include a soft start pin coupled to the output of the OTA for coupling an external soft start capacitor.

A method of precision margining control for a regulator according to an embodiment of the present invention includes coupling a margining resistor between first and second nodes and coupling a first offset resistor between the second node and a power supply terminal, applying a current to the first node to maintain voltage at the second node at a reference voltage level, mirroring voltage developed across the margining resistor across a second margining resistor, and adjusting a set point voltage of the regulator based on the reference voltage and the margining current developed through the second margining resistor.

The adjusting a set point voltage may include mirroring current through the second margining resistor into an offset resistor that develops an offset voltage relative to the reference voltage, and adding the offset voltage to said reference voltage.

The method may further include coupling a second offset resistor between the first node and the power supply terminal, selecting between the first and second nodes for selecting between up and down margining, and applying current to one of the first and second nodes to maintain voltage at the other node at a reference voltage level. The method may include mirroring voltage developed across the margining resistor across an up margining resistor when up margining is selected and across a down margining resistor when down margining is selected. The method may include mirroring current through the up margining resistor into a first offset resistor that develops a positive offset voltage relative to the reference voltage, and mirroring current through the down margining resistor into a second offset resistor that develops a negative offset voltage relative to the reference voltage.

The method may include adding a selected one of the positive and negative offset voltages to the reference voltage.

BRIEF DESCRIPTION OF THE DRAWING(S)

Figure 2:
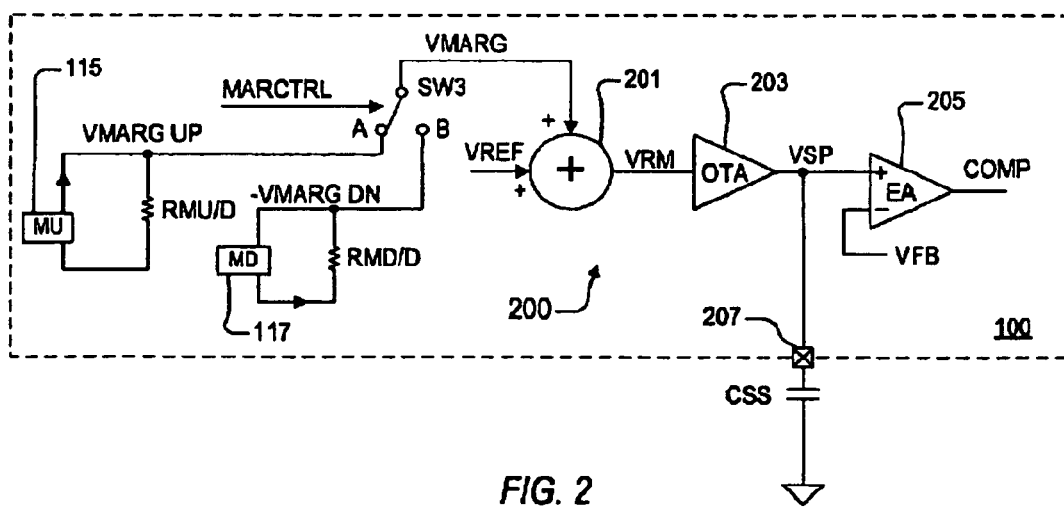
Figure 3:
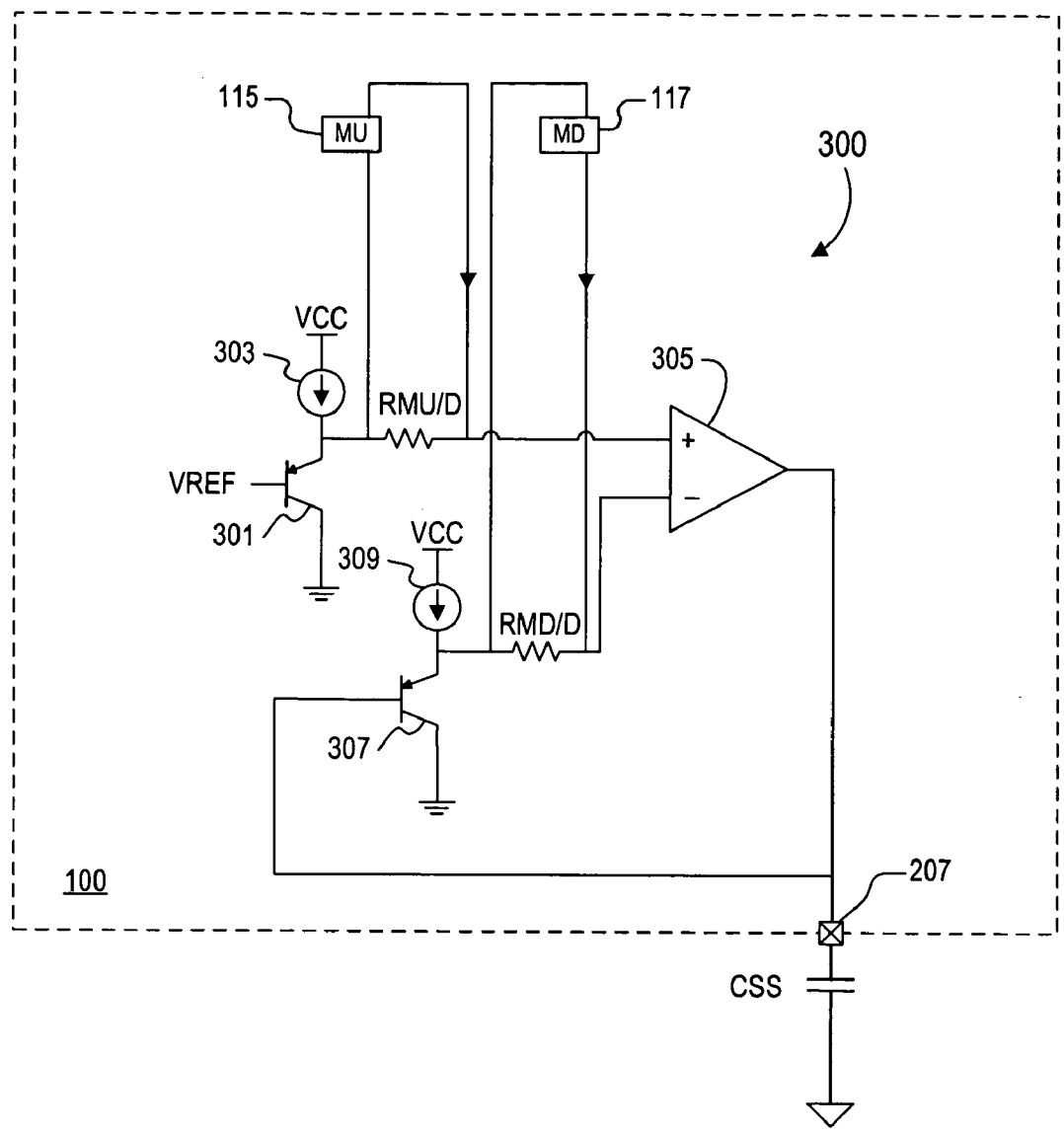

The benefits, features, and advantages of the present invention will become better understood with regard to the following description and accompanying drawings in which:

FIG. 1 is simplified schematic diagram of a portion of a DC—DC power regulator including a portion of a precision margining circuit implemented according to an exemplary embodiment of the present invention;

FIG. 2 is a simplified schematic diagram of a portion of the feedback circuit of the regulator of FIG. 1 employing margin control according to an exemplary embodiment of the present invention; and FIG. 3 is a simplified schematic diagram of a portion of the feedback circuit of the regulator device of FIG. 1 employing margining control according to a more specific embodiment of the present invention.

DETAILED DESCRIPTION

The following description is presented to enable one of ordinary skill in the art to make and use the present invention as provided within the context of a particular application and its requirements. Various modifications to the preferred embodiment will, however, be apparent to one skilled in the art, and the general principles defined herein may be applied to other embodiments. Therefore, the present invention is not intended to be limited to the particular embodiments shown and described herein, but is to be accorded the widest scope consistent with the principles and novel features herein disclosed.

FIG. 1 is simplified schematic diagram of a portion of a DC—DC power regulator device 100 including a precision margining circuit 101 implemented according to an exemplary embodiment of the present invention. The regulator device 100 is illustrated as implemented on a separate integrated circuit (IC) including a margin control (MARCTRL) pin 103, a positive offset pin (OFS+) 105 and a negative offset (OFS–) pin 107. The OFS+ and OFS– pins 105 and 107, forming first and second margining nodes, respectively, enable coupling of the external portion of the margining circuit 101, which is a voltage divider circuit 109 including resistors ROFS+, ROFS– and RMARG. The resistor ROFS+ is coupled between a supply reference node (e.g., ground or GND) and the OFS+ pin 105, the resistor ROFS– is coupled between GND and the OFS– pin 107, and the resistor RMARG is coupled between the pins 105 and 107. As further described below, the MARCTRL pin 103 is used to enable and disable and control margining operation. The MARCTRL pin 103 is asserted high (e.g., +5 Volts (V)) to add a positive margin voltage VMARG UP to a reference voltage level, and is asserted low (e.g., 0V) to add a negative margin voltage –VMARG DOWN. VMARG UP is determined by the combination of resistors RMARG and ROFS+ and VMARG DOWN is determined by the combination of resistors RMARG and ROFS–.

Within the regulator device 100, the margining circuit 101 includes an amplifier 111 having an inverting input receiving a reference voltage VREF. In one embodiment, VREF is a precision internal bandgap voltage of 0.6V as known to those skilled in the art. The output of the amplifier 111 is coupled to the gate of an N-channel device Q1, such as a metal-oxide semiconductor, field-effect transistor (MOS- FET), having its source coupled to a source voltage VCC. The non-inverting input of the amplifier 111 is coupled to the common pole of a first single-pole, double-throw (SPDT) switch SW1 having selectable terminals labeled A and B. The drain of Q1 is coupled to the common pole of a second SPDT switch SW2, also having selectable terminals labeled A and B. The MARCTRL pin 103 is coupled to a control terminal 113 of both switches SW1 and SW2, such that both switches SW1, SW2 select terminal A when MARCTRL is asserted high and terminal B when MARCTRL is asserted low. The A terminal of switch SW1 and the B terminal of switch SW2 are coupled together and to the OFS+ pin 105. The B terminal of switch SW1 and the A terminal of switch SW2 are coupled together and to the OFS− pin 107.

The MARCTRL pin 103 is also coupled to the select or enable or activation inputs of four amplifiers A1, A2, A3 and A4. In the embodiment shown, the amplifiers A1 and A2 are used for up margining control and are "enabled" when the MARCTRL pin 103 is asserted high, which also selects the A terminals of the switches SW1 and SW2. The amplifiers A3 and A4 are used for down margining control and are "enabled" when the MARCTRL pin 103 is asserted low, which also selects the B terminals of the switches SW1 and SW2. The term "enabled" as used herein incorporates any of the various embodiments of enabling, selecting, activating, etc. The OFS+ pin 105 is coupled to the inverting input of the amplifier A3 and to the non-inverting input of the amplifier A2. The OFS− pin 107 is coupled to the inverting input of the amplifier A1 and to the non-inverting input of the amplifier A4. The output of amplifier A1 is coupled to the gate of another N-channel MOSFET Q2, having its source coupled to VCC and its drain coupled to the non-inverting input of amplifier A1 and to a first current input terminal of a current mirror 115 for margin up (MU) control. The current mirror 115 has a second current mirror input terminal coupled to one end of an up margining resistor RMU, having a second end coupled to the output and the inverting input of the amplifier A2. The output of amplifier A3 is coupled to the gate of another N-channel MOSFET Q3, having its source coupled to VCC and its drain coupled to the non-inverting input of amplifier A3 and to a first current input terminal of a margin down (MD) current mirror 117. The current mirror 117 has a second current mirror input terminal coupled to one end of a down margining resistor RMD, having a second end coupled to the output and the inverting input of the amplifier A4.

In operation, the MARCTRL pin 103 is pulled high to VCC or some other source voltage for up margining control, so that the A terminals of the switches SW1 and SW2 are selected and the amplifiers A1 and A2 are enabled. The amplifier 111 drives the OFS− pin 107 to regulate the voltage at OFS+ to VREF, which establishes a precise current through ROFS+ to GND. The same precise current flows from the OFS− pin 107 through the resistors RMARG and ROFS+, establishing a precise voltage across the margining resistor RMARG. The voltage across RMARG is mirrored by amplifiers A1 and A2 across another, internal margining resistor RMU, which establishes an up margining current through the resistor RMU. The up margining current is sensed by the input current path of the current mirror 115, which mirrors this current at its output current path. In a similar manner, the MARCTRL pin 103 is pulled low to GND or 0V or the like for down margining control, so that the B terminals of the switches SW1 and SW2 are selected and the amplifiers A3 and A4 are enabled. The amplifier 111 drives the OFS+ pin 105 to regulate the voltage at OFS− to VREF, which establishes a precise current through ROFS−.

The same precise current flows from the OFS+ pin 105 through the resistors RMARG and ROFS− to GND, establishing a precise voltage across the resistor RMARG. The voltage across RMARG is mirrored by amplifiers A3 and A4 across another down margining resistor RMD, which establishes a down margining current through the resistor RMD. The down margining current is sensed by the input current path of the current mirror 117, which mirrors this current at its output current path. If the MARCTRL pin 105 is tri-stated or open-circuited, then the amplifiers A1–A4 are disabled, de-activated or otherwise de-selected and margining is disabled.

An optional margin capacitor CMARG, shown using dotted lines, is coupled between the OFS+ pin 105 and the OFS− pins 107. The CMARG capacitor is used to limit the slew-rate or the rate of change of the voltage between the OFS+ pin 105 and the OFS− pin 107. Since the margining control voltage is used to adjust the reference voltage in the feedback path of the regulator device 100, it directly effects the voltage level of the output voltage controlled by the regulator device 100. Thus, it is desired that the rate of change of the margining voltage be sufficiently small to prevent fast changes of the output voltage. If desired or otherwise necessary to limit the slew-rate, then the CMARG capacitor is provided to limit the rate of change of the margining voltage developed across RMARG to control slew-rate. The electrostatic discharge (ESD) circuitry of the OFS+ and OFS− pins 105 and 107, however, should be configured (enhanced) to handle the potentially large currents generated by the charged CMARG capacitor when the MARCRTL pin 103 switches or is disconnected. For example, one of the OFS+ or OFS− pins 105 and 107 is pulled to ground, so that the CMARG capacitor pulls the other pin below ground and draws a significant level of current. The ESD capacity of the pins 105 and 107 is configured to handle the additional current level in this situation.

FIG. 2 is a simplified schematic diagram of a portion of a feedback circuit 200 of the regulator device 100 employing margin control according to an exemplary embodiment of the present invention. Similar components from FIG. 1 assume identical reference numbers. The current mirror 115 has a pair of current output terminals coupled across a resistor RMU/D for generating the up margining voltage VMARG UP. The current mirror 117 has a pair of current output terminals coupled across a resistor RMD/D for generating the down margining voltage VMARG DOWN. The current from the current mirror 117 is shown reversed through the resistor RMD/D to effectively generate the down margining voltage as −VMARG DOWN. VMARG UP is provided to a selectable terminal A and −VMARG DOWN is provided to a selectable terminal B of a SPDT switch SW3, having a common pole coupled to a selected margining voltage VMARG. The switch SW3 is controlled by the MARCTRL pin 103 (or signal MARCTRL or version thereof), so that VMARG UP is selected as VMARG when MARCTRL is high and −VMARG DOWN is selected as VMARG when MARCTRL is low. The VMARG signal is applied to one input of a two-input combiner or adder 201, which receives VREF at its other input. The adder 201 adds VREF and VMARG together to generate a reference voltage with margin signal VRM. The VRM signal is provided to the input of an operational transconductance amplifier (OTA) circuit 203, which has an output that generates a set point voltage VSP used to control the output voltage level of the regulator device 100. The output of the OTA circuit 203 is coupled to one end of a soft-start capacitor CSS and to the non-inverting input of an error amplifier (EA) 205. In the embodiment shown, the capacitor CSS is implemented off-chip and coupled through a pin 207. The EA 205 receives a feedback voltage signal VFB at its inverting input, and generates a compensation signal COMP at its output.

The resistance of the resistor RMU is D times the resistance of RMU/D, where "D" is an arbitrary scaling factor selected for the particular implementation. Likewise, the resistance of the resistor RMD is D times the resistance of RMD/D. In one embodiment, for example, D is 5 so that the voltage VMARG UP is ⅕ that of the voltage developed across the resistor RMU and the voltage VMARG DOWN is ⅕ that of the voltage developed across the resistor RMD. Since the voltage developed across the resistor RMU is the same as the voltage across the resistor RMARG when the MARCTRL pin 103 is high, the voltage VMARG UP= (VREF/D)*(RMARG/ROSF+), where the asterisk "*" denotes multiplication and the forward slash "/" denotes division. Also, the voltage VMARG DOWN=(VREF/D)* (RMARG/ROSF−) when the MARCTRL pin 103 is low. The voltage VRM=VREF+VMARG UP when MARCTRL is high and VRM=VREF−VMARG DOWN when MARCTRL is low. The voltage VRM=VREF when MARCTRL is tri-stated or open-circuited disabling margining control. The OTA circuit 203 drives the VSP signal at its output across the capacitor CSS to the voltage level of VRM at its input. The capacitor CSS performs slew-rate control eliminating any need for the capacitor CMARG previously described. However, for embodiments in which CSS or other slew-rate limiting circuitry is not provided, the capacitor CMARG is provided for slew-rate control.

The EA 205 drives the COMP signal based on VFB and VSP as controlled by the OTA circuit 203. The voltage level of VFB is proportional to the voltage based on the normal value of VSP, which is VREF in the illustrated embodiment. For example, if VREF is 0.6V, then the output voltage VOUT (not shown) generated by the regulator device 100 is divided down to the 0.6V level for purposes of regulation. Thus, when VSP is increased by adding VMARG UP or decreased by adding −VMARG DOWN, the output voltage is modified accordingly pursuant to margin control operation. In one specific embodiment, RMARG is 10 kilohms (kΩ) and the margining range is +/−200 millivolts (mV), so that the resistors ROFS+ and ROFS− are at least 6 kΩ. The OFS+ and OFS− pins 105, 107 are completely independent and can be set to different margining levels.

FIG. 3 is a simplified schematic diagram of a portion of the feedback circuit 300 of the regulator device 100 employing margining control according to a more specific embodiment of the present invention. Similar components from FIGS. 1 and 2 assume identical reference numbers. The VREF signal is provided to the base of a PNP bipolar transistor 301, having its collector coupled to ground. A current source 303 is coupled between VCC and the emitter of the transistor 301 for providing current to the transistor 301. The current source 303 and the transistor 301 collectively operate as a voltage follower, which develops approximately the voltage level of VREF at the emitter of the transistor 301. The emitter of the transistor 301 is coupled to one end of the resistor RMU/D, having its other end coupled to the non-inverting input of an OTA 305. Another PNP bipolar transistor 307 and current source 309 are coupled between VCC and ground in a similar manner and collectively operate as another voltage follower, where the emitter of the transistor 307 is coupled to one end of the resistor RMD/D. The other end of the resistor RMD/D is coupled to the inverting input of the OTA 305. The output of the OTA 305, which asserts the VSP signal, is coupled to the base of the transistor 307 and to the pin 207 for coupling to the external capacitor CSS. In one embodiment, the resistors RMU/D and RMD/D are substantially equal and related to the master margin resistors RMU and RMD, respectively, as previously described.

The current output terminals of the current mirror 115 are coupled across the resistor RMU/D to inject margining up current into the end of resistor RMU/D coupled to the non-inverting input of the OTA 305. In this manner, a positive offset voltage is developed across the resistor RMU/D which is added to VREF and applied to the OTA 305 to increase the voltage level of VSP. The current output terminals of the current mirror 117 are coupled across the resistor RMD/D coupled to the inverting input of the OTA 117. In this case, assuming no additional margining voltage across the resistor RMU/D, the additional voltage developed across the resistor RMD/D effectively reduces the voltage at the emitter of the transistor 307 to maintain the voltage level of VREF at the inverting input of the OTA 305. This has the effect of decreasing the voltage of VSP by the down margining voltage developed across the resistor RMD/D. In either case, the selected margining current is added to VREF and applied in the feedback circuit 300 of the regulator device 100 to adjust VSP, which in turn adjusts the output voltage of the regulator device 100 by a proportional amount.

Employing standard IC processing techniques and precision 0.1% resistors for the external voltage divider circuit 109, the total error is 0.5% or less and total system error is 1% or less. The design allows even greater accuracy, such as less than 0.1% error which adds less than 0.02% to the system set point error. The precision margining circuit 101 uses a third resistor in the external voltage divider circuit 109, which renders internal current sources used in prior designs unnecessary. The internal current sources exhibited significant differences (e.g. 10%) over process and temperature variations, resulting in significant loss of precision. In the prior design, an additional dedicated pin was added to reduce set point error. The additional pin is not necessary for the precision margining circuit 101 to achieve the desired levels of precision. In this manner, the present invention offers many advantages over prior margining designs including an increase in margining set point precision without the cost of additional pins to the system device (e.g., IC).

Although the present invention has been described in considerable detail with reference to certain preferred versions thereof, other versions and variations are possible and contemplated. For example, particular voltage or current levels and component values and device types are arbitrary and determined in accordance with the particular implementation. Those skilled in the art should appreciate that they can readily use the disclosed conception and specific embodiments as a basis for designing or modifying other structures for providing out the same purposes of the present invention without departing from the spirit and scope of the invention as defined by the appended claims.

What is claimed is:

1. A precision margining circuit, comprising:
 a first margining resistor coupled between first and second margining nodes;
 a first offset resistor coupled between said second margining node and a supply reference node;
 a first amplifier circuit that drives current to said first margining node to establish a first reference voltage at said second margining node;

a second amplifier circuit that mirrors a first margining voltage developed between said first and second margining nodes across a second margining resistor to develop a first margining current; and a feedback circuit that adjusts a set point voltage based on a second reference voltage and said first margining current.

2. The precision margining circuit of claim 1, wherein said first amplifier circuit comprises:

an amplifier having a first input receiving said first reference voltage, a second input coupled to said second margining node and an output; and a current device having a current control input coupled to said output of said amplifier and a current path coupled to said seeend first margining node.

3. The precision margining circuit of claim 1, further comprising:

a current mirror having a current path input that senses said first margining current and a current path output that drives proportional current through a third margining resistor to develop a second margining voltage; and a summing circuit that adds said second reference voltage to said second margining voltage to adjust said set point voltage.

4. The precision margining circuit of claim 1, further comprising:

a second offset resistor coupled between said first margining node and said supply reference node;

select logic, responsive to a margining control node having up and down states to switch between applying up and down margining, that couples an output and a feedback input of said first amplifier circuit to said first and second margining nodes, respectively, in said up state and that couples said output and said feedback input of said first amplifier circuit to said second and first margining nodes, respectively, in said down state;

said second amplifier circuit being enabled when said margining control node is in said up state;

a third amplifier circuit, enabled when said margining control node is in said down state, that mirrors a second margining voltage developed between said first and second margin nodes across a third margining resistor to develop a second margining current; and said feedback circuit adjusting said set point voltage based on said second reference voltage and said first and second margining currents.

5. The precision margining circuit of claim 4, wherein said first, second and third amplifier circuits, said select logic and said feedback circuit are implemented on a common integrated circuit (IC), wherein said first and second margining nodes and said margining control node are implemented as pins on the IC.

6. The precision margining circuit of claim 4, further comprising a margining capacitor coupled between said first and second margining nodes.

7. The precision margining circuit of claim 4, further comprising:

first and second current mirrors having current path inputs that sense said first and second margining currents, respectively, and current path outputs that drive proportional currents through fourth and fifth margining resistors to develop second and third margining voltages, respectively; and said feedback circuit incorporating said fourth and fifth margining resistors and adjusting said set point voltage based on said second and third margining voltages.

8. The precision margining circuit of claim 4, wherein said second and third amplifier circuits each comprise:

a first buffer amplifier that drives a current device to drive current through a first end of a corresponding one of said second and third margining resistors based on voltage developed at said output of said first amplifier circuit; and a second buffer amplifier that drives a second end of said corresponding margining resistor based on voltage developed at said feedback input of said first amplifier circuit.

9. An integrated circuit (IC), comprising:

a margining control amplifier circuit that drives current at an output to control voltage at an input based on a reference voltage;

first and second offset pins for coupling to an external margining voltage divider;

a margining control pin having at least two states including an up state and a down state;

select logic that selectively switches said output of said margining control amplifier circuit between said first and second offset pins and that selectively switches said input of said margining control amplifier circuit between said second and first offset pins based on a state of said margining control pin; and a mirror amplifier circuit that mirrors voltage across said first and second offset pins across a first margining resistor.

10. The IC of claim 9, wherein said select logic comprises:

a first switch having a common pole coupled to said input of said margining control amplifier circuit, first and second switched terminals coupled to said first and second offset pins, respectively, and a control input coupled to said margining control pin; and a second switch having a common pole coupled to said output of said margining control amplifier circuit, first and second switched terminals coupled to said first and second offset pins, respectively, and a control input coupled to said margining control pin.

11. The IC of claim 9, further comprising:

a first up margining resistor and a first down margining resistor;

an up amplifier circuit, enabled by said margining control pin when in said up state, that mirrors voltage between said first and second offset pins across said first up margining resistor; and a down amplifier circuit, enabled by said margining control pin when in said down state, that mirrors voltage between said first and second offset pins across said first down margining resistor.

12. The IC of claim 11, wherein said up and down amplifier circuits each comprise:

a first amplifier having an inverting input coupled via said select logic to said controlled current path of said current device, a non-inverting input coupled to a first end of a corresponding one of said first up and down margining resistors, and an output;

a second current device having a current control input coupled to said output of said first amplifier and a controlled current path coupled between a source voltage and said non-inverting input of said first amplifier; and a second amplifier having an inverting input and an output coupled to a second end of said corresponding one of said first up and down margining resistors and a non-inverting input coupled via said select logic to said input of said margining control amplifier circuit.

13. The IC of claim 12, further comprising:
an up current mirror having a current path input coupled in series with said first up margining resistor and a current path output;
a down current mirror having a current path coupled in series with said first down margining resistor and a current path output;
a second up margining resistor coupled to said current path output of said up current mirror for developing an up margining voltage; and
a second down margining resistor coupled to said current path output of said down current mirror for developing a down margining voltage.

14. The IC of claim 13, further comprising a feedback circuit that adjusts a set point voltage based on said reference voltage and said up and down margining voltages.

15. The IC of claim 14, wherein said feedback circuit further comprises:
a summing circuit that combines said reference voltage and said up and down margining voltages;
an operational transconductance amplifier (OTA) having an input coupled to said summing circuit and an output providing said set point voltage; and
an error amplifier that controls a compensation signal based on a sampled output voltage and said set point voltage.

16. The IC of claim 15, further comprising a soft start pin coupled to said output of said OTA for coupling an external soft start capacitor.

17. A method of precision margining control for a regulator, comprising:
coupling a margining resistor between first and second nodes and coupling a first offset resistor between the second node and a power supply terminal;
applying a current to the first node to maintain voltage at the second node at a reference voltage level;
mirroring voltage developed across the margining resistor across a second margining resistor; and
adjusting a set point voltage of the regulator based on the reference voltage and the margining current developed through the second margining resistor.

18. The method of claim 17, wherein said adjusting a set point voltage comprises:
mirroring current through the second margining resistor into an offset resistor that develops an offset voltage relative to the reference voltage; and
adding the offset voltage to said reference voltage.

19. The method of claim 17, further comprising:
coupling a second offset resistor between the first node and the power supply terminal;
selecting between the first and second nodes for selecting between up and down margining; and
said applying a current comprising applying current to a selected one of the first and second nodes to maintain voltage at a non-selected one of the first and second nodes at a reference voltage level.

20. The method of claim 19, wherein said mirroring voltage comprises mirroring voltage developed across the margining resistor across an up margining resistor when up margining is selected and across a down margining resistor when down margining is selected.

21. The method of claim 20, further comprising:
mirroring current through the up margining resistor into a first offset resistor that develops a positive offset voltage relative to the reference voltage; and
mirroring current through the down margining resistor into a second offset resistor that develops a negative offset voltage relative to the reference voltage.

22. The method of claim 21, wherein said adjusting a set point voltage comprises adding a selected one of the positive and negative offset voltages to the reference voltage.

* * * * *

UNITED STATES PATENT AND TRADEMARK OFFICE
CERTIFICATE OF CORRECTION

PATENT NO. : 6,975,163 B2 Page 1 of 1
APPLICATION NO. : 10/813254
DATED : December 13, 2005
INVENTOR(S) : Gustavo J. Mehas, James W. Leith and Brandon D. Day It is certified that error appears in the above-identified patent and that said Letters Patent is hereby corrected as shown below:

Title page; item [75] should read --inventor James W. Leith, Canada--

Signed and Sealed this

Twenty-fifth Day of December, 2007

JON W. DUDAS
*Director of the United States Patent and Trademark Office*